United States Patent
Batra et al.

(10) Patent No.: US 8,102,187 B2
(45) Date of Patent: *Jan. 24, 2012

(54) LOCALIZED CALIBRATION OF PROGRAMMABLE DIGITAL LOGIC CELLS

(75) Inventors: Anuj Batra, Dallas, TX (US); Srinivas Lingam, Dallas, TX (US); Kit Wing S. Lee, McKinney, TX (US); Clive D. Bittlestone, Allen, TX (US); Ekanayake A. Amerasekera, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 205 days.

This patent is subject to a terminal disclaimer.

(21) Appl. No.: 12/433,189

(22) Filed: Apr. 30, 2009

(65) Prior Publication Data
US 2009/0273361 A1 Nov. 5, 2009

Related U.S. Application Data

(60) Provisional application No. 61/050,054, filed on May 2, 2008.

(51) Int. Cl.
*H03K 19/173* (2006.01)
(52) U.S. Cl. ........... 326/38; 326/16; 326/33; 326/37; 324/750.02; 324/601
(58) Field of Classification Search ........... 326/81–83, 326/86–87, 37–41, 47, 16, 26, 30; 324/415–423, 324/160–180, 76.11, 74, 130, 750.02, 601; 365/185.19, 185.03, 185.17, 185.18, 185.22, 365/185.28
See application file for complete search history.

(56) References Cited

U.S. PATENT DOCUMENTS

| 5,059,835 | A | 10/1991 | Lauffer et al. | |
|---|---|---|---|---|
| 5,801,548 | A | 9/1998 | Lee et al. | |
| 6,118,302 | A * | 9/2000 | Turner et al. | 326/68 |
| 6,504,763 | B1 | 1/2003 | Yang et al. | |
| 7,327,608 | B2 | 2/2008 | Lee et al. | |
| 2002/0140496 | A1* | 10/2002 | Keshavarzi et al. | 327/534 |
| 2003/0053335 | A1* | 3/2003 | Hart et al. | 365/185.05 |
| 2004/0141377 | A1 | 7/2004 | Arai et al. | |
| 2005/0280437 | A1* | 12/2005 | Lewis et al. | 326/38 |
| 2006/0097749 | A1* | 5/2006 | Ahmad et al. | 326/30 |
| 2006/0119382 | A1* | 6/2006 | Shumarayev et al. | 326/33 |

* cited by examiner

*Primary Examiner* — Shawki S Ismail
*Assistant Examiner* — Christopher Lo
(74) *Attorney, Agent, or Firm* — Steven A. Shaw; W. James Brady; Frederick J. Telecky, Jr.

(57) ABSTRACT

An integrated circuit (IC) includes self-calibrating programmable digital logic circuitry. The IC includes at least one programmable digital logic cell, wherein the first programmable digital logic cell provides (i) a plurality of different accessible circuit configurations or (ii) a voltage level controller. A self-calibration system is provided that includes at least one reference device, a measurement device for measuring at least one electrical performance parameter that can affect a processing speed of the first programmable digital logic cell or at least one parameter that can affect the electrical performance parameter using the reference device to obtain calibration data. A processing device maps the calibration data or a parameter derived therefrom to generate a control signal that is operable to select from the plurality of different accessible circuit configurations or a voltage level output to change the processing speed of the programmable digital logic cell.

37 Claims, 8 Drawing Sheets

LOCALIZED CALIBRATION OF PROGRAMMABLE DIGITAL LOGIC CELLS

CROSS REFERENCE TO RELATED APPLICATIONS

This application claims the benefit of Provisional Application Ser. No. 61/050,054 entitled "SELF-CALIBRATION TO ADDRESS VARIABILITY AND PROCESS OPTIMIZATION", filed May 2, 2008, which is herein incorporated by reference in its entirety.

FIELD

Embodiments of the invention generally relate to integrated circuits (ICs) including programmable logic devices (PLDs) which are configurable to reduce performance variability.

Electronics designers continually adapt their designs to account for changes in design approaches and electronics technology. One such design issue encountered is the increase of the relative process variability between nodes, such as when transitioning from 45 nm to 28 nm. This variability generally results in circuit designers adding additional margins to their designs to account for uncertainty in operational circumstances, such as spatial transistor variations, local transistor mismatch, $V_T$ skew, and interlayer interconnect variation. Designs of ICs such as digital logic circuits formed from electronically connected digital logic cells, therefore, are increasingly being affected by inherent variations in the digital logic cells, which result from IC performance affecting parameters, such as resulting from variation in manufacturing processes.

Current design approaches require designers to be aware of and account for process variations for each digital logic cell, such as the most basic standard two transistor CMOS inverter cell. Variations in the supply voltage and/or ground reference voltage result in changes in the time required for the cell to process the input signal to produce the output signal, such as indicated in its delay time (also referred to as the cell delay), rise time and fall time parameters.

Increased variations in cell delays produce a significant increase in the worst-case cell delays over the nominal delays. In some cases, the worst-case delays may be so significant that traditional logic design methods are rendered ineffective.

Further, standard logic cells are generally produced having standard drive strengths. Thus, designers generally limit and/or adjust their designs to utilize the available standard drive strengths. As used herein, the rise or fall time of a cell resulting from fabrication with a strong process is defined to be less than the rise or fall time of a cell resulting from a weak process. Changing a cell to utilize a different drive strength may result in the need for the entire cell to be redesigned and the IC refabricated with the new element, which further increases development time and resources.

Attempts to overcome this performance variation problem have generally focused on utilizing mathematical model and specially-developed algorithms to model the cell delay or other timing parameter. In the case of cell delays, for handling large worst-case delays, a statistical timing analysis methodology can be used to model the rise and fall times as random variables. The statistical models are then used by the designer to check for critical paths and close timing, rather than designing the logic to meet the worst-case rise time. Specially-developed algorithms add complexity to the solution, and, therefore, increase the time required to analyze the solution and develop the IC product.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the invention include methods for calibrating ICs comprising at least one programmable digital logic cell, and related ICs. Embodiments of the invention provide localized calibratable programmable digital logic cells that can address circuit performance variability, such as due to process variations, supply voltage variations, and environmental variables (e.g., temperature). As described above, programmable logic cells with 45 nanometers (nm) and smaller architectures can show a significant increase and variation in timing parameters such as cell delay (e.g., rise time and/or fall time) which can be compensated for by embodiments of the invention.

Programmable digital logic cells according to embodiments of the invention generally provide a plurality of different accessible circuit configurations, or a voltage level controller that can comprise a supply voltage or back gate voltage controller. At least one electrical performance parameter (e.g., PMOS or NMOS strength) that can affect a processing speed of the programmable digital logic cell or a parameter that can affect the electrical performance parameter (e.g., voltage supplied, or temperature) is measured to obtain calibration data using a reference device. As used herein, a "reference device" refers to a device or circuit that is not electrically coupled to the programmable digital logic cell upon which a measurement therefrom provides calibration data. The reference device may be on or off the IC. In the embodiment the reference device is off the IC, the reference device is generally a test structure on a wafer, wherein the IC and a plurality of other ICs are formed on the same wafer.

The calibration data is used to program the digital logic cell(s), such as by generating at least one control signal from the calibration data which is operable to select one of the plurality of different circuit configurations or a voltage level output by the voltage level controller. The selection implemented by the programming changes the processing speed of the programmable digital logic cell. The selection which changes the processing speed of the programmable digital logic cell can be based on, but is not limited to, changing parameters including cell delay time, rise time, fall time, duty-cycle errors and sample and hold times (e.g., for digital to analog converter ICs). Although it is generally desirable to increase processing speed, embodiments of the invention also include selecting a circuit configuration or a voltage level output to reduce the processing speed (e.g., to save power).

The programmable digital logic cells can embodied as programmable digital logic cells or reprogrammable (i.e. continuously, periodically or aperiodically) digital logic cells. In the programmable embodiment, the selective coupling circuitry is provided for selectively coupling or selectively decoupling programmable tuning circuitry to a dedicated digital logic cell.

As used herein, a "dedicated" digital logic cell is a digital logic cell that is configured, independent of the programming for the programmable digital logic cell, to provide at least one input and at least one output for the programmable digital logic circuit and to perform at least one digital logic function. The programmable tuning circuitry and selective coupling circuitry can be used to compensate for variables that can affect the processing speed of the digital logic cell, such as temperature, power supply level, and process-induced device, interconnect and/or parasitic device variations, wherein the programmable tuning circuitry provides compensation at the digital logic cell or transistor level.

The selective programming can be based on a plurality of fuses or a plurality switches. For example, the step of setting the state of the fuses (e.g., applying energy to blow certain fuses and rendering those fuses electrically open) or switches comprises the programming in this embodiment. Such programming is generally performed a single time, such as while the ICs are together with a plurality of other ICs in wafer form at wafer probe, or as packaged discrete ICs during package test. In another embodiment, the IC is integrated into an electronic assembly (e.g., an electronic product) comprising a workpiece (electronic substrate, e.g., printed circuit board) which can comprise one or more other ICs mounted on the workpiece.

In another programmable digital logic circuit embodiment, a memory circuit is provided on the IC, such as a register, which can establish enablement states for the control signals, so that the performance characteristics can be effectively fixed for the digital logic cell. Thus, when the digital logic cell is initialized, the control signals can be adjusted in accordance with the settings established in the memory, resulting in stable or "static" compensated performance characteristics for the digital logic circuit.

As described above, in the reprogrammable digital logic cell embodiment the programmable digital logic cells can be programmed and reprogrammed a plurality of times, and in one embodiment be considered to be continuously programmable during operation. In this embodiment the reprogrammable digital logic cell is operable to receive at least one control signal that modifies to the programmable tuning circuitry, which adjusts the processing speed of the reprogrammable digital logic cell, such as by changing its rise time and/or fall time to reduce cell delay.

In another embodiment, discrete programmable cells of a digital logic cell formed from programmable cells can be dynamically adjusted when the digital logic cell is operational, which will dynamically change performance characteristics of the programmable digital logic cell as desired. Thus, designing digital logic circuits using programmable digital logic cells according to embodiments of the invention permits designers to exert fine-grained control of the circuit's performance characteristics down to the cell/transistor level.

DETAILED DESCRIPTION

Figure 1:
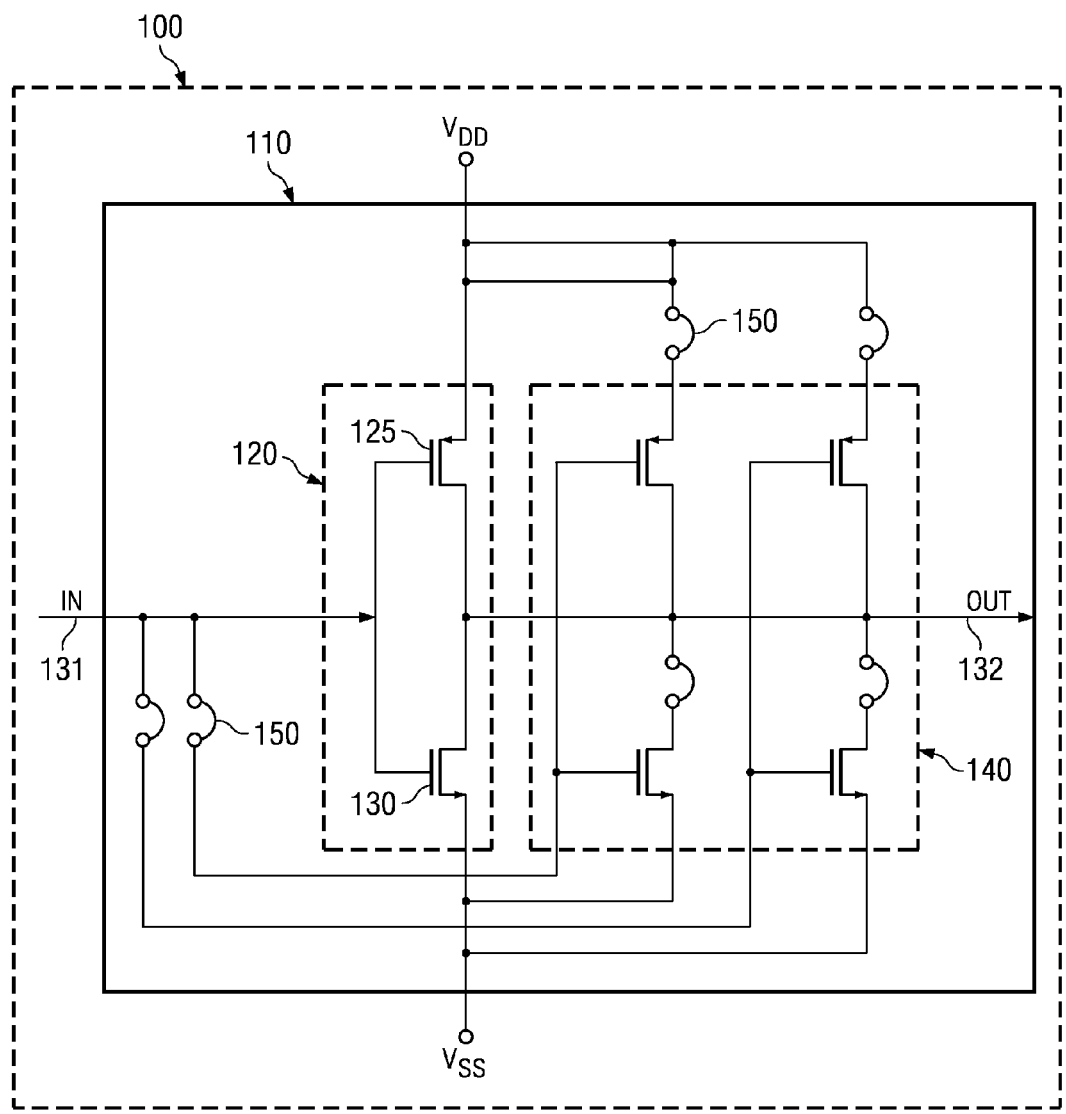
FIG. 1 is a block level schematic diagram of a CMOS IC including at least a first programmable digital logic cell that comprises a first dedicated digital logic cell, programmable tuning circuitry, and circuitry for coupling or decoupling the programmable tuning circuitry to the first dedicated digital logic cell, according to an embodiment of the invention.

Embodiments of the invention are described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. Embodiments of the invention are not limited by the illustrated ordering of acts or events, as some acts may occur in different orders and/or concurrently with other acts or events. Furthermore, not all illustrated acts or events are required to implement a methodology in accordance with embodiments of the invention.

FIG. 1 is a block level schematic diagram of a CMOS IC 100 including at least one programmable digital logic cell 110, referred to as first programmable digital logic cell 110, that comprises a first dedicated digital logic cell 120, programmable tuning circuitry 140, and circuitry for coupling or decoupling 150 the programmable tuning circuitry 140 to first dedicated digital logic cell 120, according to an embodiment of the invention. First dedicated digital logic cell 120 includes at least one input node 131 and at least one output node 132 that reflects performance of a digital logic function. First dedicated digital logic cell 120 is generally a standard digital logic circuit that comprises a plurality of transistors including at least one PMOS transistor 125 and at least one NMOS transistor 130 configured to perform at least one digital logic function, such as the exemplary standard CMOS inverter shown in FIG. 1. More generally, first dedicated digital logic cell 120 generally provides a Boolean logic function, such as, but not limited to, NAND, AND, OR, NOR, XOR, XNOR or an inverter function.

The first programmable digital logic cell 110 includes tuning circuitry 140 coupled by circuitry for coupling or decoupling 150 shown as fuses 150 to at least one of the plurality of nodes of the first dedicated digital logic cell 120. Tuning circuitry 140 as shown in FIG. 1 comprises a first and second inverter that are in parallel relative to first dedicated digital logic cell 120 when programmed (e.g., fuses 150 made to be electrically conductive) to both be active. The operation of first programmable logic cell 110 as reflected in the tuning circuit output 132 is thus different based on the programming of fuses 150, which after programming changes a processing speed for the first programmable digital logic cell 110. As noted above, fuses can generally be replaced by switches.

Generally, the processing speed (e.g., cell delay) for first programmable digital logic cell 110 with one or more of the inverters in tuning circuitry 140 programmed to be active is less than the processing speed for first programmable digital logic cell without any of the inverters in tuning circuitry 140 programmed to be active (e.g., the cell delay is approximately the cell delay provided by first dedicated digital logic cell 120 alone). However, as described above, embodiments of the invention also include programming to decrease the processing speed for first programmable digital logic cell 110 as compared to the first dedicated digital logic cell 120 alone.

As known in the art, fuses, such as fuses 150 shown in FIG. 1, may be grouped into two classes, laser fuses and electrical fuses. Laser fuses are blown by a chip-external laser beam which irradiates specific fuses to supply enough energy to blow the fuses. For laser fuses, a laser beam is simply pointed at the fuses which are to be blown, that is, addressing by location. Known electrical fuses can be a wire type or a semiconductor layer type. For the wire type, a relatively low-resistive element, such as a wire, increases its resistance permanently once a high current stresses this element. The stressed wire creates an opening similar to traditional laser-fuses. For the layer type fuse, a high-resistive layer between conductive layers permanently decreases its resistance from a high voltage or consecutive current, leading to a breakdown of this layer. For example, an isolator or dielectric material which starts to break through at a certain voltage level and stays permanently damaged forming a low resistive path. Unlike laser fuses, electrical fuses are not blown solely by addressing by location. Instead, electrical fuses are blown by accessing pins of a chip or bond pads of a wafer, and in some arrangements together with electrical control signals that control addressing by location.

Figure 2:
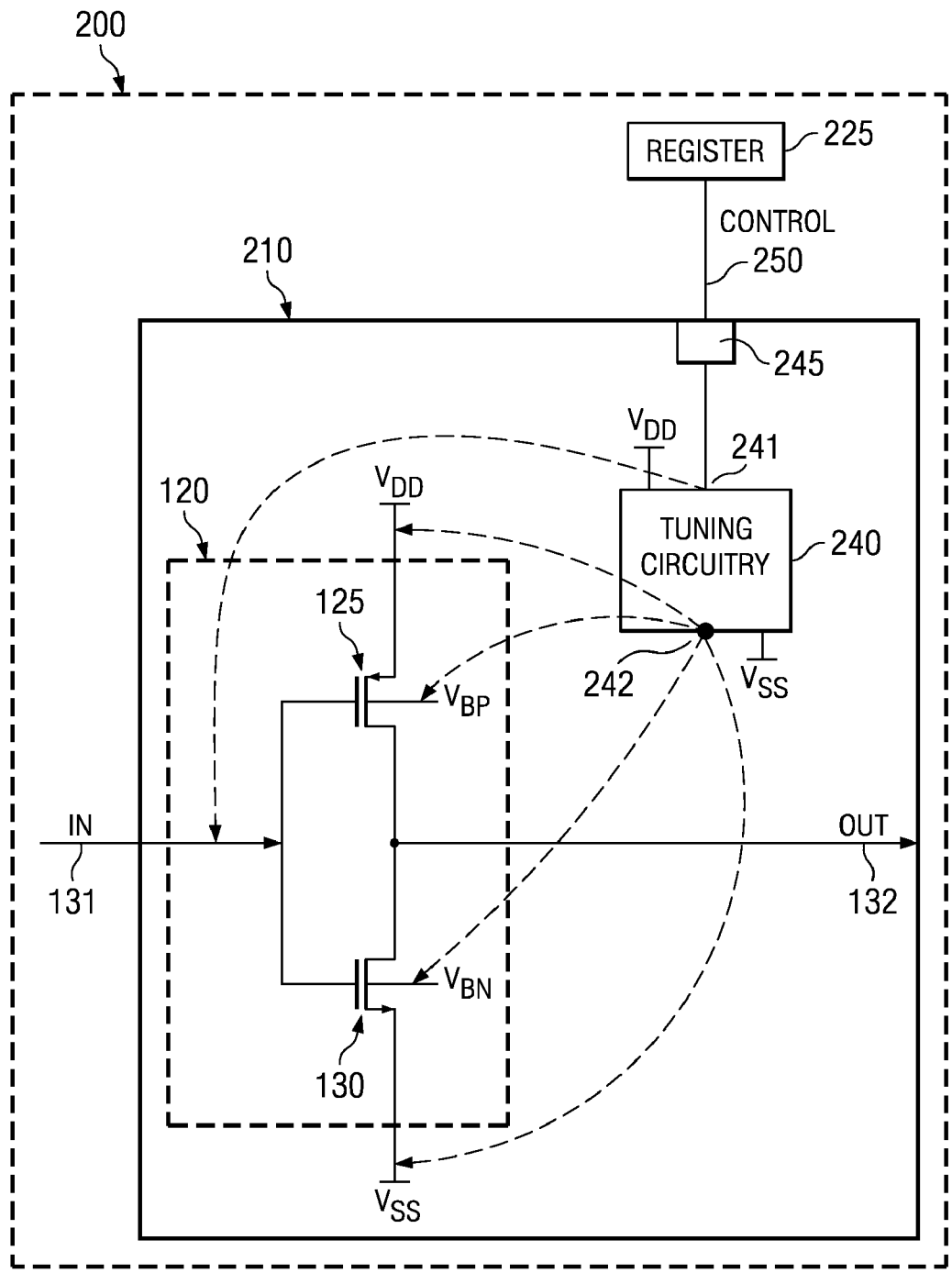
FIG. 2 is a block level schematic diagram of a CMOS IC including at least a first reprogrammable digital logic cell comprises a first dedicated digital logic cell, programmable tuning circuitry, and circuitry for coupling or decoupling the programmable tuning circuitry to the first dedicated digital logic cell, according to an embodiment of the invention.

FIG. 2 is a block level schematic diagram of a CMOS IC 200 including at least a first reprogrammable digital logic cell 210 that comprises a first dedicated digital logic cell 120, and programmable tuning circuitry 240. IC 200 includes register 225, which stores programming information which allows output of at least one control signal 250 which is used to program the programmable tuning circuitry 240. Selective coupling circuitry in the embodiment shown comprises switch(es) 245 (e.g., transistor switches) for selectively coupling or selectively decoupling the control signal(s) 250 to the programmable tuning circuitry 240, according to an embodiment of the invention.

Programmable tuning circuitry 240 is shown including at least one tuning input node 241 and at least one tuning circuit output node 242. Dashed lines show some of many possible connections between the output 242 of programmable tuning circuitry 240 and the plurality of nodes of the first dedicated digital logic cell 120, such as made possible by switched connections. In one embodiment, the tuning input node 241 receives at least one control signal 250 that is operable to select different output states reflected at tuning circuit output 242, wherein respective ones of the different output states provide a different processing speed for the first reprogrammable digital logic cell 210. In one simplified example, in one state (e.g., control signal 250 turning programmable tuning circuitry 240 off or not turning programmable tuning circuitry 240 on) first reprogrammable digital logic cell 210 can provide a weak process/corner characteristics (i.e. resulting in a slower processing speed) and in another state (control signal 250 turning tuning circuitry 240 on) first reprogrammable digital logic cell 210 can provide a strong process corner characteristics (i.e. resulting in a faster processing speed).

In one embodiment, the first reprogrammable digital logic cell 210 is implemented in a standard cell layout wherein as well known in the art, the respective transistors are formed by gate electrode (e.g., silicided polysilicon) "fingers" that cross n-diffusion stripes (PMOS) and p-diffusion stripes (NMOS). In such an embodiment, all the PMOS transistors for first dedicated digital logic cell 120 (including PMOS 125) and PMOS transistors for programmable tuning circuitry 240 are formed in a common n-stripe and all the NMOS transistors for first dedicated digital logic cell 120 (including NMOS 130) and tuning circuitry 240 are formed in a common p-stripe. As known in the art, a single finger can be used to form the common gate for the respective transistors of a standard CMOS inverter.

Figure 3:
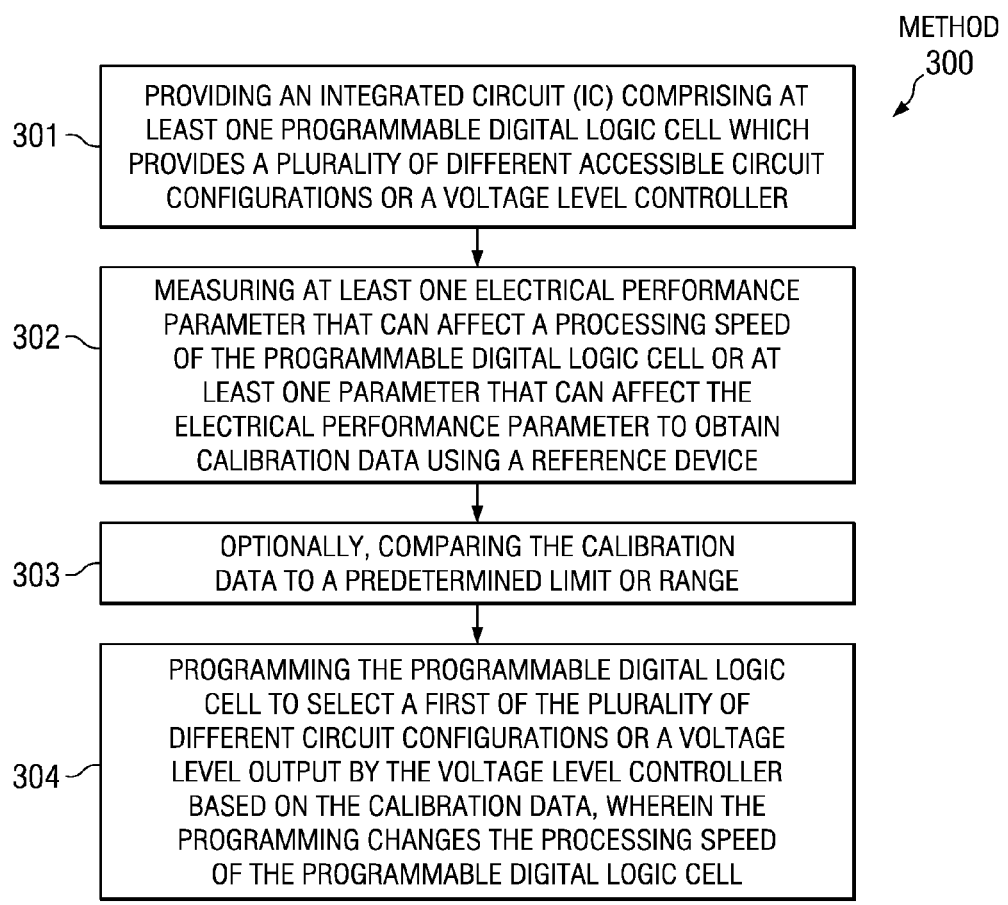
FIG. 3 shows steps in an exemplary method for calibrating an IC comprising at least one programmable digital logic cell to change the processing speed of the programmable digital logic cell, according to an embodiment of the invention.

Referring now to FIG. 3, steps are shown for an exemplary method 300 for calibrating an IC comprising at least one programmable digital logic cell to change the processing speed for the programmable digital logic cell, according to an embodiment of the invention. Step 301 comprises providing an IC comprising at least a first programmable digital logic cell which provides a plurality of different accessible circuit configurations or a voltage level controller.

Step 302 comprises measuring at least one electrical performance parameter that can affect a processing speed of the programmable digital logic cell or at least one parameter that can affect the electrical performance parameter to obtain calibration data using a reference device. The reference device can be on the IC, or off the IC. The measuring can be performed during wafer probe on a wafer comprising the IC and a plurality of other ICs, or at package test. In the wafer probe embodiment, the reference device can comprise a test circuit and thus the reference device need not be on the IC. In the package test embodiment, a reference device is generally provided on the IC. In another embodiment, the IC can also be measured while part of an electronic assembly including a workpiece (e.g., PCB), which can include one or more other IC.

In one embodiment, the programmable digital logic cell can comprise a first dedicated digital logic cell including a plurality of nodes including at least one input node and at least one output node that reflects performance of a digital logic function, programmable tuning circuitry comprising at least one tuning input and at least one tuning circuit output, and circuitry for coupling or decoupling at least one of the tuning input and tuning circuit output to at least one of the plurality of nodes of the first dedicated digital logic cell. The circuitry for coupling or decoupling can comprise a first fuse coupled to the tuning input or a second fuse coupled to the tuning circuit output (e.g., see FIG. 1). In this fuse comprising embodiment, the programming can comprise applying energy to change a state of the first and/or second fuse.

As known in the art, the operating temperature can significantly affect the processing speed of the digital logic circuit and the related IC. In one embodiment, the parameter that can affect electrical performance comprises temperature. In this embodiment, the reference device can comprise a temperature sensor, such as a resistance temperature detector (RTD) or thermistor. The temperature sensor can be formed on the IC. In other embodiments of the invention the electrical performance parameter or parameter that can affect electrical performance can comprises at least one process strength parameter, power supply level, and process-induced device, interconnect and/or parasitic device variations.

The calibration data obtained can be collected and stored temporarily and/or permanently for usage in the programming step (see step 304 described below), such as for determining the control settings/signals as described below. In one embodiment, the calibration data can be stored in one or more memory elements, such as registers.

Step 303 comprises the optional step of comparing the calibration data to a predetermined limit or range. However, embodiments of the invention need not compare the calibration data, such as for embodiments of the invention where the programming is performed continuously or performed periodically (e.g., repeated after a fixed period of time elapses). In the comparing embodiment, when the calibration data is determined to be outside the predetermined limit or range, step 304 is performed to provide a processing speed adjustment that comprises programming the programmable digital logic cell to select a first of the plurality of different circuit configurations or a voltage level output by the voltage level controller based on the calibration data. In one embodiment, the programming reduces a cell delay of the programmable digital logic cell.

In one embodiment, the method further comprises generating at least one control signal using the calibration data, and performing the programming of the programmable digital logic cell using the control signal. In this embodiment, the control signal can be obtained by mapping the calibration data or a parameter derived therefrom to the control signal using a control signal generation engine, such as a lookup table, linear function or a non-linear function. In this embodiment, the IC can include the reference device and the measuring and programming can be performed during package testing of the IC. In this embodiment, the control signal can be used to program the programmable digital logic cell at a first time, and the programming be performed at a second time after the first time by again measuring to obtain updated calibration data, generating at least one updated control signal using the updated calibration data, and programming of the programmable digital logic cell using the updated control signal.

In one embodiment, the reference device can comprise a delay line, and the calibration data can comprise a time-based measurement based on a time for a test signal to traverse the delay line. The timing for a nominal process can be known or can be measured. The difference between the actual timing and the known timing can provide calibration information on the whether the process is weak or strong.

In another embodiment, the reference device can comprise an oscillator circuit associated with at least one logic cell, and wherein the calibration data comprises a measurement of an oscillation frequency of the oscillator circuit. Different process corners can result in different oscillation frequencies. By comparing these frequencies, the process corners can be determined.

In yet another embodiment, the reference device comprises at least one programmable reference digital logic cell that matches the programmable digital logic cell. As used herein, programmable digital logic cells "match" when they provide the same circuit elements and arrangement and thus perform the same digital logic function. Matched cells may have the same or different geometries (sizes). However, calibration is generally easier to implement if the matched cells have the same geometries. In one embodiment, the calibration data can be generated by continuously or periodically (e.g., using a timer) measuring the reference cell and reading the data via hardware and/or software (e.g., CPU/DSP/MSP43O). In this embodiment, the control signal can be generated by an iterative process that varies the control signal until a desired processing speed for the programmable reference digital logic cell is obtained. The iterative process can comprise a trial-and-error generation process, or an algorithm driven generation process, such as based on least-mean square, steepest-descent algorithms, recursive-least squares, Newton-Raphson.

In one embodiment, the reference device comprises a plurality of reference circuits each formed in a plurality of separate portions of the IC, and the control signal can comprise a plurality of control signals. In this embodiment respective ones of the plurality of control signals can be used in respective ones of the plurality of separate portions of the IC.

For example, if the process is determined to be weak, then the control signal(s) can be turned on or programmed accordingly. If the process is determined to be strong, the control signal(s) for the cells can be turned off or programmed accordingly.

As described above, the calibration provided can be a one time calibration, or an updatable calibration, such as a continuous, aperiodic, or periodic calibration. As used herein, continuous self-calibration can be understood to include interval driven calibration. For example, measurements can be taken every M seconds, where M is some non-zero parameter. Thus, the calibration data can be measured every M seconds and if determined to be outside the predetermine limit or range, and the update of the control signal can be performed every M seconds. In one embodiment, calibration can be passed through a filter to "smooth out" measurements and/or slow down the update of the control signal. For example, calibration can be performed every βM seconds, where β is a non-zero parameter.

In one embodiment, calibration can be applied to a higher level such as at a flip-flop level, instead of calibrating the individual programmable digital logic cells. In this embodiment, calibration on the flip-flop can help compensate for variations in a variety of parameters, such as variations based on process, voltage and temperature. In another embodiment, calibration can be applied to a subset of a plurality of programmable digital logic cells. For example, for cells which are known to be less sensitive to the process, voltage, and temperature variations, calibration can be optionally suppressed.

Figure 4A:
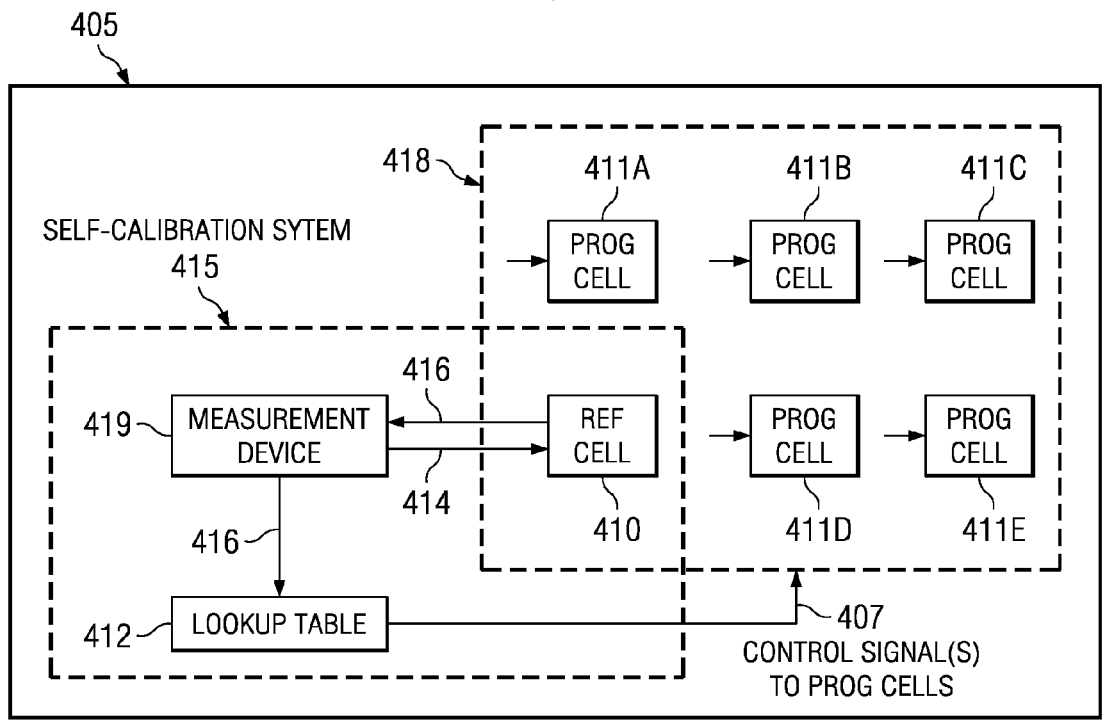
FIG. 4A is block level schematic diagram of an electronic system comprising an IC die comprising a plurality of programmable digital logic cells and a self-calibration system, according to an embodiment of the invention.

FIG. 4A is block level schematic diagram of an electronic system 405 comprising an IC die 418 comprising a plurality of programmable digital logic cells 411A-E, and a self-calibration system 415 that provides localized self-calibration to change the processing speed of IC 418, such as in response to process variability, according to an embodiment of the invention. Programmable digital logic cells 411A-E each provide a plurality of different accessible circuit configurations, generally via programming applied to a programming input shown as the arrow on the left side of the programmable digital logic cells 411A-E. In the embodiment shown, IC 418 is one of many IC die on a wafer.

Self-calibration system 415 comprises at least one reference device shown in FIG. 4A as reference cell 410 that is on the IC 418, and a measurement device 419 for measuring at least one electrical performance parameter or at least one parameter that can affect the processing speed of the digital logic cell to obtain calibration data 416, and a processing device 412 shown as lookup table 412. As noted above, processing device 412 can more generally be a processing engine that implements a suitable algorithm (e.g., based on least-mean square, steepest-descent algorithms, recursive-least squares, Newton-Raphson). Both measurement device and lookup table 412 are shown in FIG. 4A as being off the IC 418. Processing devices such as lookup table 412 generally include an associated data store for mapping the calibration data 416 for generating control signal(s) 407 that is operable to select a first of the plurality of different accessible circuit configurations, wherein the selection changes the processing speed of the programmable digital logic cells 411A-F. The same control signal(s) 407 is generally applied to the programmable digital logic cells 411A-F. Although the control signal is generally described as being an electrical signal, the control signal can also be a non-electrical signal, such as an optical or electromagnetic signal (where the control signal information can be encoded in the E or H field).

System 405 generally implements one-time probing of reference cell 410, and uses the calibration data 416 derived therefrom to set the control signal(s) 407 to be applied to the programmable digital logic cells 411A-E. Measurement device 419 applies a measurement signal shown as probe signal 414 to reference cell 410 and receives measurements in response comprising at least one electrical performance parameter which is shown as calibration data 416. Lookup table 412 receives the calibration data 416 from measurement device 419 and generates control signal(s)/setting(s) 407 therefrom which are applied to the respective programmable digital logic cells 411A-E. Control signal 407 programs the programmable digital logic cells 411A-E to effectuate self-calibration to be performed by implementing a circuit configuration from the plurality of different accessible circuit configurations that generally change a processing speed of the programmable digital logic cells 411A-E. For example, control signal 407 can calibrate programmable cells 411A-E to enable weak process corners to be strengthened. In the embodiment where programmable digital logic cells 411A-E include fuses for programming, programming based on control signal(s) 407 can comprises applying energy to change the state of fuses.

Figure 4B:
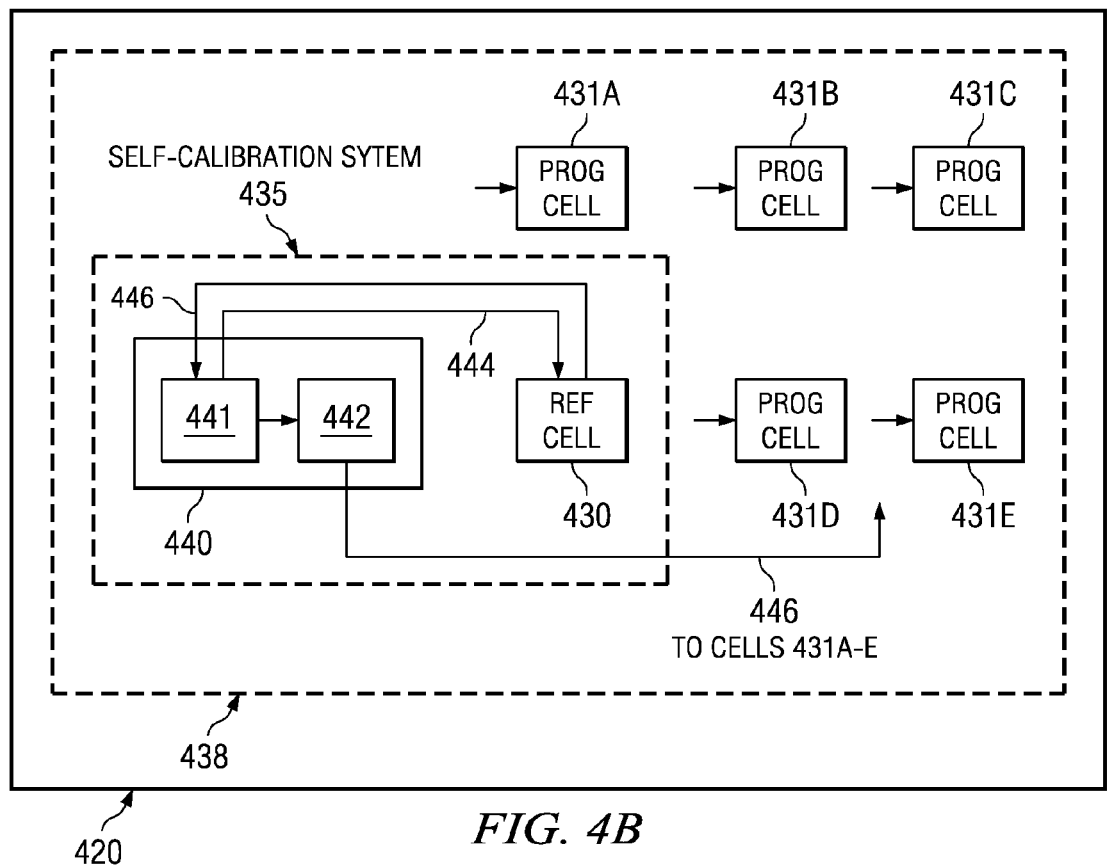
FIG. 4B is block level schematic diagram of an electronic system comprising IC die comprising a plurality of programmable digital logic cells and a self-calibration system located on the IC die, according to an embodiment of the invention.

FIG. 4B is block level schematic diagram of an electronic system 420 comprising an IC 438 including a plurality of programmable digital logic cells 431A-E and self-calibration system 435, all on the IC 438, according to an embodiment of the invention. Self-calibration system 435 includes a reference cell 430, and measurement and processing block 440 comprising measurement device 441 and lookup table 442. Probe signal 444 is applied by measurement device 441 to reference cell 430 and calibration data 446 is obtained and supplied to lookup table 442 which outputs control signal(s) 446 which are coupled to cells 431A-E. Since the self-calibration system 435 is on the IC 438, IC 438 provides the ability to obtain continuous self-calibration during operation.

Figure 4C:
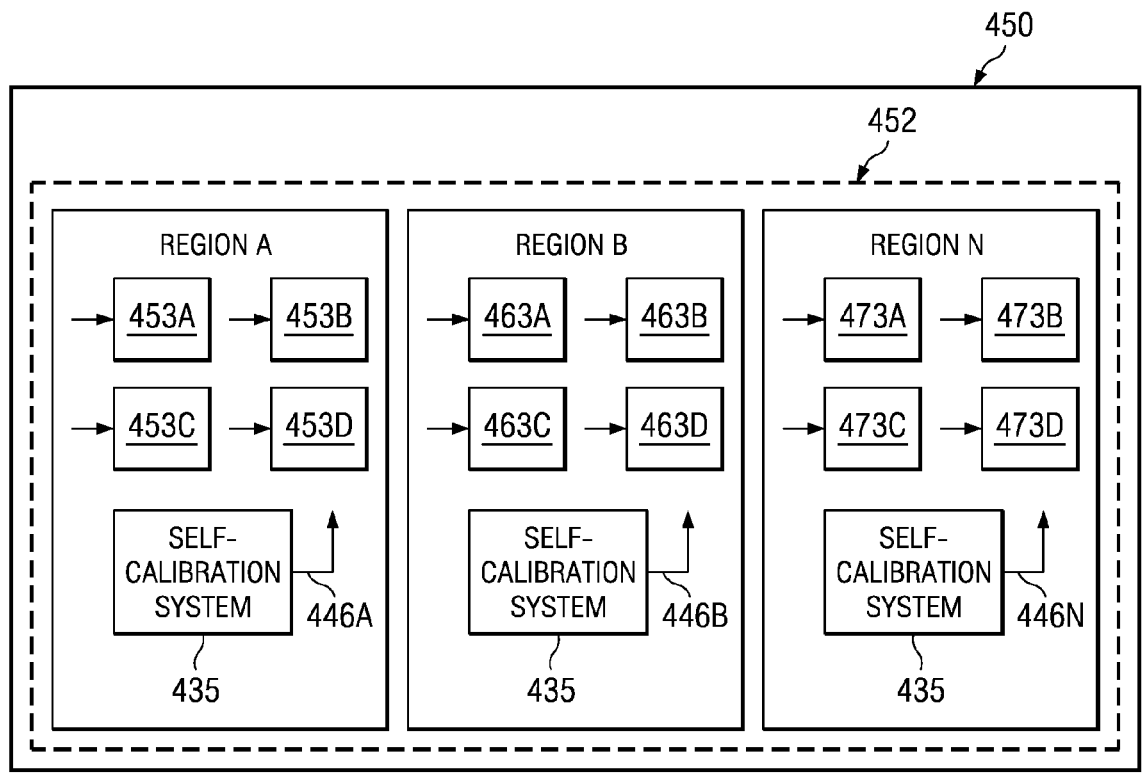
FIG. 4C is block level schematic diagram of an electronic system comprising an IC die comprising a plurality of regions A, B and N each including a plurality of programmable digital logic cells and a self-calibration system.

FIG. 4C is block level schematic diagram of an electronic system 450 comprising an IC 452 that comprises a plurality of regions A, B and N that each include a plurality of programmable digital logic cells 453A-D, 463A-D, 473A-D and self-calibration system 435 described above in FIG. 4B. Self-calibration system 435 in region A provides control signal(s) 446A, self-calibration system 435 in region B provides control signal(s) 446B and self-calibration system 435 in region N provides control signal(s) 446N. IC 452 can be utilized to independently obtain continuous calibration during operation for the programmable digital logic cells in the N regions of IC 452.

Figure 5A:
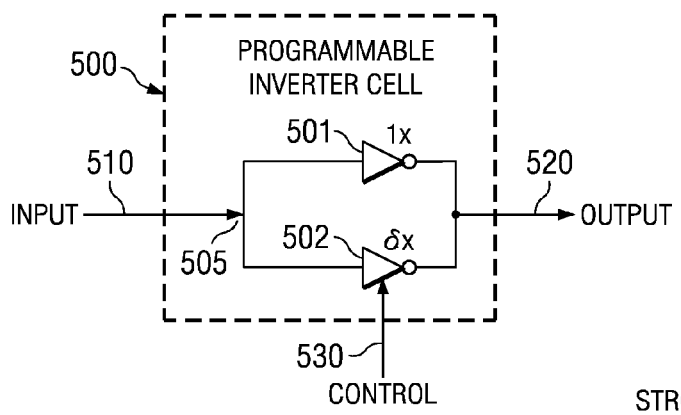
FIG. 5A is a block level schematic diagram of a programmable digital logic cell in accordance with an embodiment of the invention.

FIG. 5A is a block level schematic diagram of a programmable digital logic cell 500 in accordance with an embodiment of the invention. Programmable digital logic cell 500 comprises dedicated digital logic cell 501 and programmable tuning circuitry 502 hooked in parallel. Dedicated digital logic cell 501 is shown having a tuning strength of 1×, and programmable tuning circuitry 502 having a tuning strength of δ×, where δ is a non-zero parameter, which can be >1, =1, or <1. For example, the processing performed by programmable digital logic cell 500 having programmable tuning circuitry 502 with a tuning strength of 0.5× can be increased by 0.5× (to 1.5×) when programmable tuning circuitry 502 is activated. The programmable digital logic cell 500 embodied as two (2) inverters is shown as a single inverter for simplifying and illustrative purposes only, and that embodiment of the invention can utilize a variety of other logic cells, having a variety of logic building blocks in a variety of numbers.

The programmable tuning circuitry 502 can comprise a matched digital logic cell relative to the dedicated digital logic cell 501. Generally, the geometry of the matched digital logic cell 502 is different as compared to the dedicated digital logic cell 501, as reflected in the δ parameter. As known in the art, the close proximity provided by standard cell designs (spacings on the order of 1 μm, or less, such as between transistors in programmable tuning circuitry 502 and transistors in dedicated digital logic cell 501) improves matching through doping, etching and lithographically being essentially the same.

In one embodiment, programmable digital logic is embodied as a standard cell design. Like a standard CMOS inverter, the programmable digital logic cell 500 can generate an inverted output signal 520 upon receipt of an input signal 510 at its input lead 505. Unlike a standard CMOS inverter, programmable digital logic cell 500 is a programmable cell having adjustable processing speed based on the presence or absence of, or level of, control signal 530. For example, in one state (control signal 530 off) cell 500 can have weak process/ corner characteristics and in another state (control signal on) cell 500 can have strong process/corner characteristics. The presence of programmable tuning circuitry 502 can allow modifications to the programmable digital logic cell 500 without requiring additional fabrication or design changes. Thus, ICs including cell designs according to embodiments of the invention can be developed with reduced development time and cost.

Figure 5B:
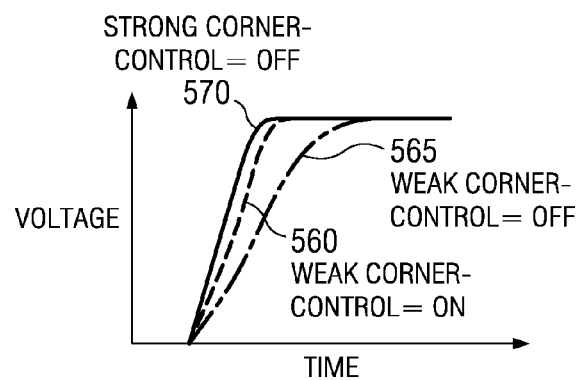
FIG. 5B is a depiction of switching characteristics for a conventional digital logic cell fabricated with a strong process corner, a dedicated digital logic cell fabricated with a weak process corner, and a programmable digital logic cell in accordance with an embodiment of the invention having a dedicated digital logic cell tuned by programmable tuning circuitry.

FIG. 5B is a depiction of switching characteristics for a conventional digital logic cell such as dedicated digital logic cell 501 fabricated with a strong process corner 570, a dedicated digital logic cell 501 fabricated with a weak process corner 565, and a programmable digital logic cell 500 according to an embodiment of the invention having dedicated digital logic cell 501 having a weak process corner tuned by programmable tuning circuitry 502 to provide a response like that from as strong process corner 570, shown as "Weak corner-Control-On" 560. The performance of programmable digital logic cell 500 in accordance with an embodiment of the invention having a dedicated digital logic cell 501 fabricated with a weak process tuned by programmable tuning circuitry 502 (response 560) can be seen to approach the switching performance of the dedicated digital logic cell 501 fabricated with a strong process corner (response 570).

Figure 6:
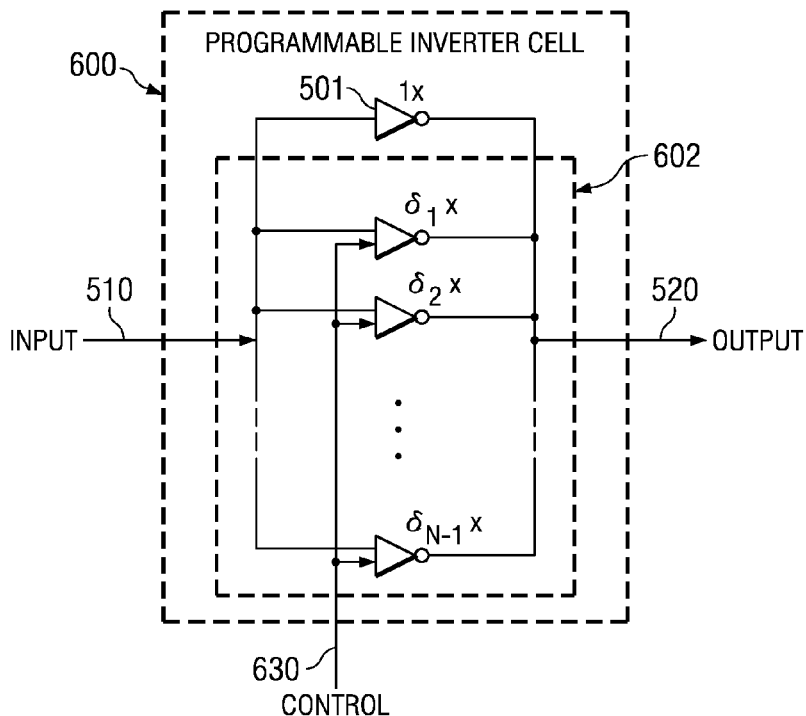
FIG. 6 is a block level schematic diagram of a programmable digital logic cell comprising a dedicated digital logic cell having programmable tuning circuitry comprising N inverter cells, in accordance with an embodiment of the invention.

FIG. 6 is a block level schematic diagram of a programmable digital logic cell 600 comprising a dedicated digital logic cell (inverter) 501 having programmable tuning circuitry 602 comprising N inverter cells, in accordance with an embodiment of the invention. Each of the N inverter cells can comprise a finger in a standard cell design. The δ parameters for the respective N inverter cells can be the same or different. In one embodiment, the δ parameters are binary weighted. Control signal is shown as 630. As noted above, the use of an inverter cell to demonstrate embodiments of the invention is for illustrative purposes only, and that embodiments of the invention can be utilized with a variety of digital logic cells, such as NAND, XOR, OR, etc.

The N elements of the programmable tuning circuitry 602 can be selectively activated by the control signal 630, such as using known addressing circuitry and methodologies. That is, different ones of the N elements of programmable tuning circuitry 602 can be activated each time the process-tuning digital inverter cell having N elements 605 executes the process to account for dynamic operating conditions. For example, all logic tuning elements 630 can be activated to augment a severely weak process, whereas only a single one of the N logic tuning elements may be activated for a slightly weak process, and none of the N logic tuning elements may be activated for a strong process. It is generally appropriate to only activate respective ones of the N elements to achieve the minimum tuning strength addition needed to reach the desired switching performance, since any additional tuning strength beyond the tuning strength needed to reach the desired switching performance will generally increase power dissipation and provide little performance enhancement.

In one embodiment, the N elements of programmable tuning circuitry 602 can be configured such that the N elements are centered on a nominal process strength. In the case N comprises an even quantity, the nominal process strength can activate only half of the N elements. Less than half of the logic tuning elements could be used for a strong process, and more than half of the logic tuning elements could be used for a weak process. This approach can be extended to account for N=an odd number of elements and/or balancing techniques that activate a quantity of the N elements not based on halves. For example, for N=10, the design can be configured to activate 6 logic elements to reach a desired processing speed for the cell for a nominal process strength.

Figure 7:
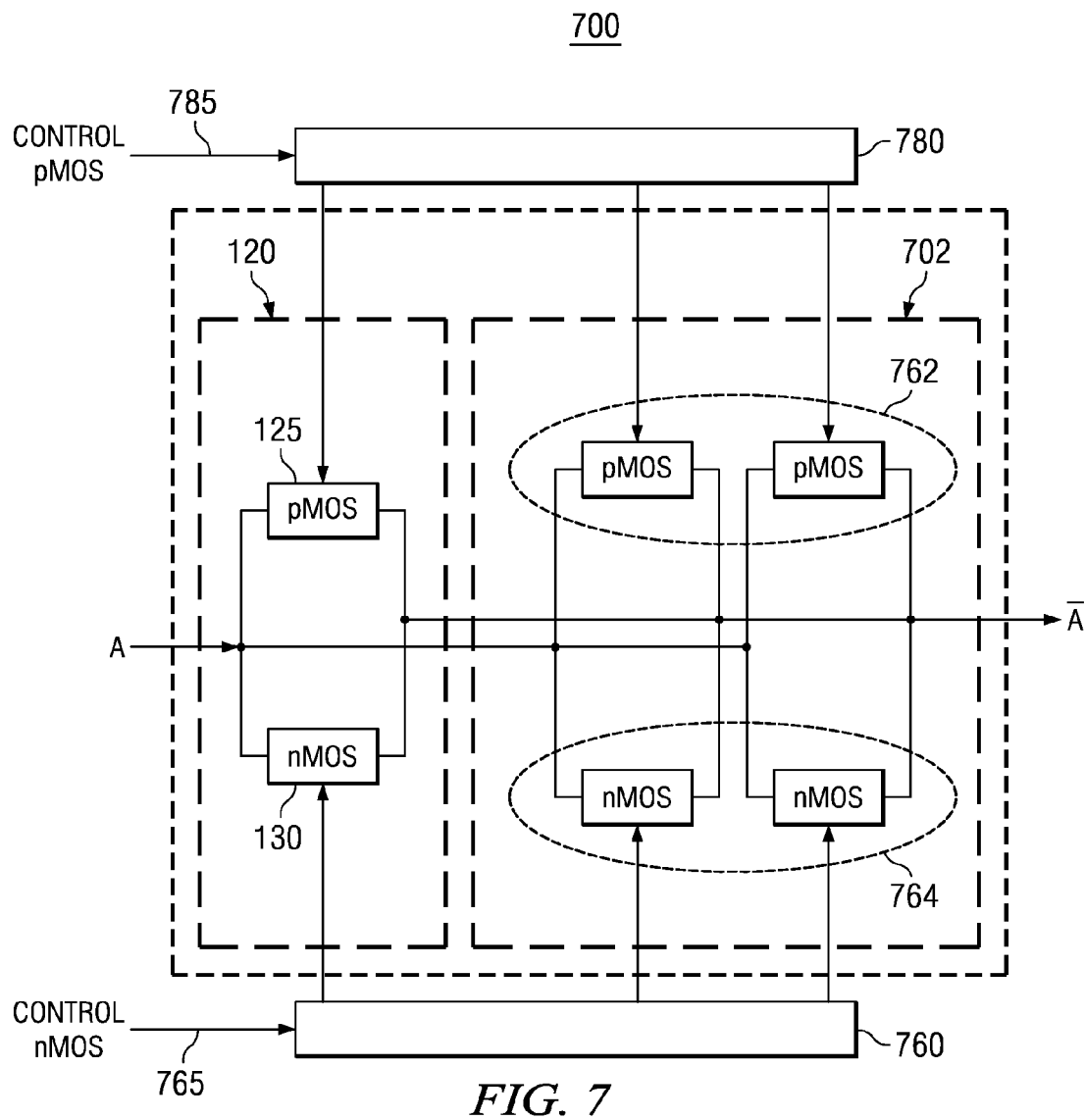
FIG. 7 is a block level schematic diagram of a programmable digital logic cell having skewing ability comprising a first digital logic cell (inverter) comprising first PMOS and first NMOS transistor, and programmable tuning circuitry comprising a plurality of additional PMOS transistors and a plurality of additional NMOS transistors, according to an embodiment of the invention.

FIG. 7 is a block level schematic diagram of a programmable digital logic cell 700 having skewing ability comprising a first dedicated digital logic cell (inverter) 120 comprising first PMOS 125 and first NMOS 130, and programmable tuning circuitry 702 comprising a plurality of additional PMOS transistors 762 and a plurality of additional NMOS transistors 764, according to an embodiment of the invention. Selective PMOS coupling circuitry 780 selectively couples a PMOS control signal 785 to at least a portion of the first PMOS transistor 125 and the plurality of additional PMOS transistors 762 and selective NMOS coupling circuitry 760 selectively couples an NMOS control signal 765 to at least a portion of the NMOS transistor 130 and the plurality of additional NMOS transistors 764. Skew as used herein refers to turning on a different number of PMOS and NMOS transistors in the programmable tuning circuitry. Hence, the technique of turning on more PMOS devices (as compared to NMOS devices) to compensate for a weak PMOS corner (or the inverse) can be generally applied to inverter cells and other digital logic cells. Independent control for activating the PMOS transistors and NMOS transistors allows for a finer level of control. For example, if the PMOS is weak and the NMOS is strong, then more PMOS transistors selected from 125, 762 will be activated by PMOS control signal 785 via selective PMOS coupling circuitry 780 to have the resulting rise time to match the fall time which is set by selected ones of the NMOS transistors 130, 764.

Figure 8:
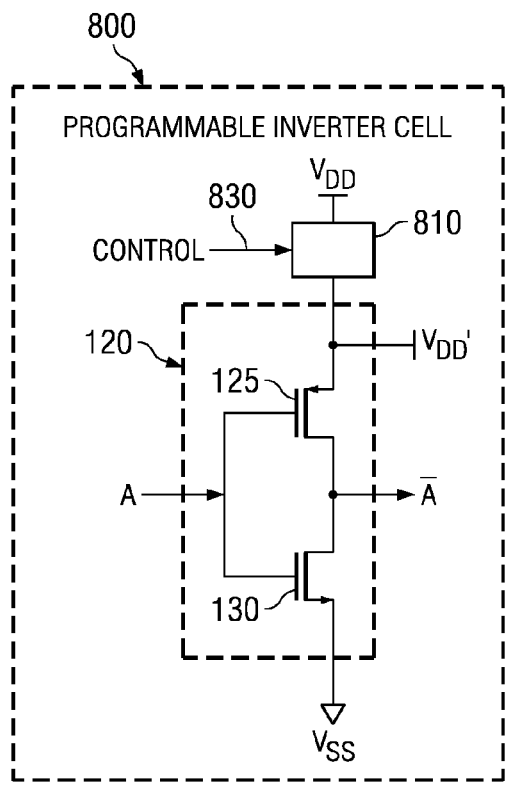
FIG. 8 is a block level schematic diagram of a programmable digital logic cell, wherein the programmable tuning circuitry comprises a voltage controller for controlling a level of VDD supplied to the first programmable digital logic cell, according to an embodiment of the invention.

FIG. 8 is a block level schematic diagram of a programmable digital logic cell 800 wherein the programmable tuning circuitry comprises a voltage controller 810 for controlling a level of VDD supplied to first dedicated digital logic cell 120, according to an embodiment of the invention. As shown in FIG. 8, voltage controller 810 receives a high supply voltage shown as VDD and based on the control signal 830 received controls the level of the VDD to provide VDD' which is supplied to the drain of PMOS 125. VDD' can be higher or lower than VDD. For example, when the process is weak, the VDD' can be >VDD to improve the processing speed of the digital logic cell (e.g., rise time). Conversely, when the process is strong, VDD' can be <VDD without degrading the processing speed of the digital logic cell. Unlike the other programmable digital logic cells described above, programmable digital logic cell 800 is configured to utilize voltage tuning to tune dynamic performance of the first dedicated digital logic cell 120, instead of using programmable tuning circuitry comprising logic tuning elements. It should be noted, however, that the embodiments of the invention include programmable digital logic cells that include voltage tuning to tune the processing speed of the programmable digital logic cell as well as tuning circuitry comprising logic tuning elements.

Figure 9:
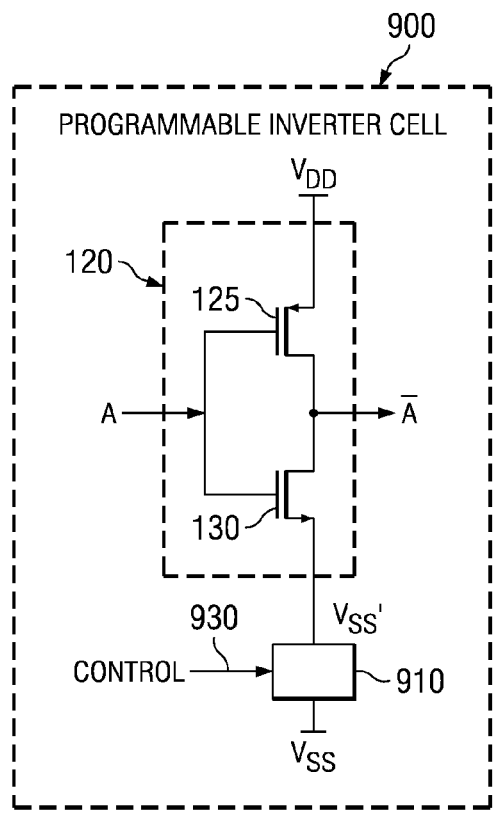
FIG. 9 is a block level schematic diagram of a programmable digital logic cell wherein the programmable tuning circuitry comprises a voltage controller for controlling a level of VSS supplied to the first programmable digital logic cell.

FIG. 9 is a block level schematic diagram of a programmable digital logic cell 900 wherein the programmable tuning circuitry comprises a voltage controller 910 for controlling a level of VSS supplied to the first programmable digital logic cell 900, according to an embodiment of the invention. As shown in FIG. 9, voltage controller 910 receives a low supply voltage shown as VSS and based on control signal 930 controls the level of VSS to provide VSS' which is supplied to the source of NMOS 130. VSS' can be higher or lower than VSS. It should be noted that the ground reference voltage is typically set according to the nominal process of the digital logic cell. However, this embodiment of the invention is not limited in this respect.

Figure 10:
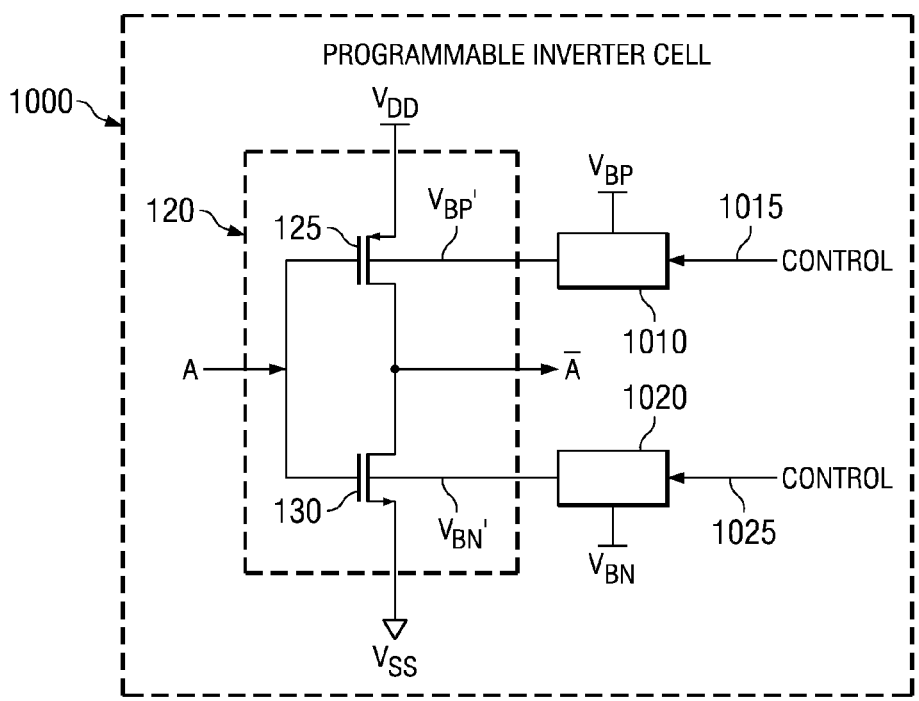
FIG. 10 is a block level schematic diagram of a programmable digital logic cell wherein the programmable tuning circuitry comprises a voltage controller for controlling a level of a back gate voltage, according to an embodiment of the invention.

FIG. 10 is a block level schematic diagram of a programmable digital logic cell 1000 wherein the programmable tuning circuitry comprises a voltage controller 1010 for controlling a level of a voltage supplied to a back gate (VBP) for the first PMOS transistor 125, and a voltage controller 1020 for controlling a level of a voltage supplied to a back gate (VBN) for the first NMOS transistor 130, according to an embodiment of the invention. Control signal 1015 is coupled to voltage controller 1010 and control signal 1025 is coupled to voltage controller 1020. Typically, back gate voltages are tied to the source terminals of the cell (i.e. $V_{BP}=V_{DD}$ and $V_{BN}=V_{SS}$), though this embodiment of the invention is not limited in this respect. VBP' can generally be greater than, equal to or less than VBP, and VBN' can generally be greater than, equal to or less than VBN. Although the back gate voltage is shown controlled for both PMOS 125 and NMOS 130, embodiments of the invention can include controlling only one of the back gate voltage levels.

The tuning back gate voltages shown in FIG. 10 can independently adjust the performance of the PMOS 125 and NMOS transistor 130 of the inverter (or other logic element) to compensate for performance affecting variations, such as process variations. For example, when the NMOS 130 is strong and the PMOS 125 is weak, the VBP' can be set $>V_{DD}$ to make the PMOS 125 stronger. Alternately, VBN'>VSS (e.g., 0.15 volts when VSS=ground) to make NMOS 130 weaker.

Figure 11:
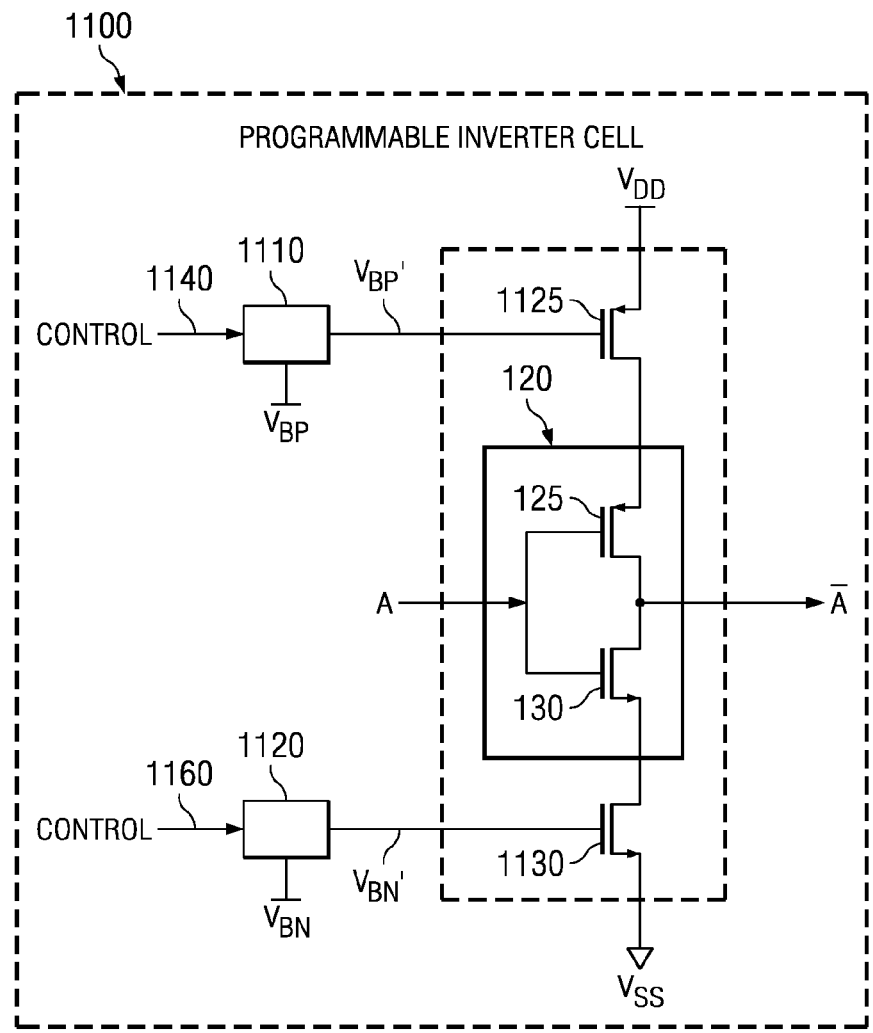
FIG. 11 is a block level schematic diagram of a programmable digital logic cell that includes programmable tuning circuitry implementing series control according to an embodiment of the invention.

FIG. 11 is a block level schematic diagram of a programmable digital logic cell 1100 that includes programmable tuning circuitry implementing series control, according to an embodiment of the invention. Programmable digital logic cell 1100 includes a first dedicated digital logic cell 120, and programmable tuning circuitry implementing series control comprising PMOS series pullup transistor 1125 and NMOS series pulldown transistor 1130. The programmable tuning circuitry also comprises a voltage controller 1110 for controlling a level of a voltage supplied to a gate (VBP') for PMOS transistor 1125, and a voltage controller 1120 for controlling a level of a voltage supplied to the gate (VBN') for the NMOS transistor 1130. Control signal 1140 controls the level of VBP, shown as VDP' output by voltage controller 1110, while control signal 1160 controls the level of VBN, shown as VBN' output by voltage controller 1120. The voltage controllers 1110 and 1120 can comprise circuit components capable of dynamically altering the bias voltage of the specific transistor in response to the control signals 1140 and 1160, respectively. Typically, bias voltages VBP' and VBN' are set to a nominal value (i.e., $V_{BPo}$ and $V_{BNo}$, respectively) for the cell's 1100 nominal process, environmental or other operating conditions, though this embodiment of the invention is not limited in this respect.

Including additional transistors 1125 and 1130 can allow the current through the first dedicated digital logic cell 120 to be independently adjusted, which, in turn, can control the processing speed of the programmable digital logic cell 1100. For example, to increase the rise time for cell 1100, PMOS 1125 can receive a control signal 1140 that decreases the bias voltage (VBP') applied to the gate of PMOS transistor 1125 below its nominal value (VBP). Alternately, NMOS 1130 can be receive a control signal 1160 that increases the bias voltage (VBN) applied to gate of NMOS transistor 1130 above its nominal value (VBN).

Figure 12:
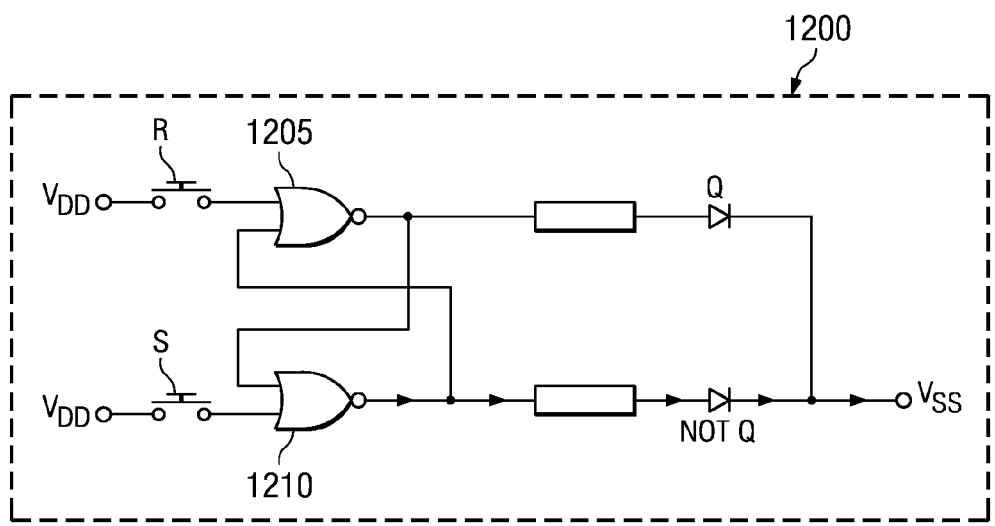
FIG. 12 shows a schematic diagram of an RS flip-flop that includes at least one programmable digital logic cell, according to an embodiment of the invention.

FIG. 12 shows a schematic diagram of an RS flip-flop 1200 that includes at least one programmable digital logic cell, according to an embodiment of the invention. The flip-flop 1200 has two control inputs labeled R and S. There are also two outputs to the flip flop 1200, Q and Q-bar (shown as Not-Q). RS flip-flop 1200 is shown realized by cross coupling two NOR gates 1205 and 1210 as shown in FIG. 12. As known in the art, a 2 input NOR gates can be realized using 2 PMOS transistors and 2 NMOS transistors. Each of the NOR gates 1205 and 1210 can comprise programmable digital logic cells having programmable tuning circuitry coupled to any of the transistors, according to an embodiment of the invention.

Embodiments of the invention can be integrated into a variety of process flows to form a variety of devices and related products. Exemplary ICs include high speed digital logic, memory, mixed signal, integrated RF, digital ICs including CPUs, DSPs, GPUs, microcontrollers, digital logic used in RF, such as PLLs, sigma-delta modulators, DACs, ADCs and system clock distribution networks. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the embodiments of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has,", "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for calibrating an integrated circuit (IC) comprising at least one programmable digital logic cell, said programmable digital logic cell providing a plurality of different accessible circuit configurations or comprising a voltage level controller, comprising:
   measuring at least one electrical performance parameter that can affect a processing speed of said programmable digital logic cell or at least one parameter that can affect said electrical performance parameter to obtain calibration data using a reference device, and
   programming said programmable digital logic cell to select a first of said plurality of different circuit configurations or a voltage level output by said voltage level controller based on said calibration data, wherein said programming changes said processing speed of said programmable digital logic cell, wherein said measuring and said programming are performed during wafer probing of a wafer comprising said IC and a plurality of other ICs, and wherein said wafer includes said reference device.

2. The method of claim 1, further comprising generating at least one control signal using said calibration data, wherein said control signal implements said programming.

3. The method of claim 2, further comprising comparing said calibration data to a predetermined limit or range, and when said calibration data is determined to be outside said predetermined limit or range, generating said control signal to implement said programming.

4. The method of claim 2, wherein said control signal is obtained by mapping said calibration data or a parameter derived therefrom to obtain said control signal using a lookup table, linear function or a non-linear function.

5. A method for calibrating an integrated circuit (IC) comprising at least one programmable digital logic cell, said programmable digital logic cell providing a plurality of different accessible circuit configurations or comprising a voltage level controller, comprising:
   measuring at least one electrical performance parameter that can affect a processing speed of said programmable digital logic cell or at least one parameter that can affect said electrical performance parameter to obtain calibration data using a reference device, and
   programming said programmable digital logic cell to select a first of said plurality of different circuit configurations or a voltage level output by said voltage level controller based on said calibration data, wherein said programming changes said processing speed of said programmable digital logic cell, wherein said programmable digital logic cell comprises a first dedicated digital logic cell including a plurality of nodes including at least one input node and at least one output node that reflects performance of a digital logic function, programmable tuning circuitry comprising at least one tuning input and at least one tuning circuit output, and circuitry for coupling or decoupling at least one of said tuning input and said tuning circuit output to at least one of said plurality of nodes of said first dedicated digital logic cell, wherein said circuitry for coupling or decoupling comprises a first fuse coupled to said tuning input or a second fuse coupled to said output, and wherein said programming comprises applying energy to change a state of said first or said second fuse, wherein said measuring and said programming are performed during wafer probing of a wafer comprising said IC and a plurality of other ICs, and wherein said wafer includes said reference device.

6. The method of claim 1, wherein said measuring and said programming are performed while said IC is integrated into an electronic assembly comprising a workpiece.

7. The method of claim 1, wherein said measuring and said programming is performed during package testing said IC, and wherein said IC includes said reference device.

8. A method for calibrating an integrated circuit (IC) comprising at least one programmable digital logic cell, said programmable digital logic cell providing a plurality of different accessible circuit configurations or comprising a voltage level controller, comprising:
   measuring at least one electrical performance parameter that can affect a processing speed of said programmable digital logic cell or at least one parameter that can affect said electrical performance parameter to obtain calibration data using a reference device, and
   programming said programmable digital logic cell to select a first of said plurality of different circuit configurations or a voltage level output by said voltage level controller based on said calibration data, wherein said programming changes said processing speed of said programmable digital logic cell;
   generating at least one control signal using said calibration data; and
   performing said programming of said programmable digital logic cell using said control signal at a first time;
   performing said programming at a second time after said first time comprising again measuring of said calibration data to obtain updated calibration data, generating at least one updated control signal using said updated calibration data, and programming of said programmable digital logic cell using said updated control signal, wherein said measuring and said programming is performed during package testing said IC, and wherein said IC includes said reference device.

9. The method of claim 1, wherein said reference device comprises a delay line, and wherein said calibration data comprises a time-based measurement based on a time for a test signal to traverse said delay line.

10. A method for calibrating an integrated circuit (IC) comprising at least one programmable digital logic cell, said programmable digital logic cell providing a plurality of different accessible circuit configurations or comprising a voltage level controller, comprising:
    measuring at least one electrical performance parameter that can affect a processing speed of said programmable digital logic cell or at least one parameter that can affect said electrical performance parameter to obtain calibration data using a reference device comprising an oscillator circuit associated with at least one logic cell, and wherein said calibration data comprises a measurement of an oscillation frequency of said oscillator circuit; and
    programming said programmable digital logic cell to select a first of said plurality of different circuit configurations or a voltage level output by said voltage level controller based on said calibration data, wherein said programming changes said processing speed of said programmable digital logic cell.

11. A method for calibrating an integrated circuit (IC) comprising at least one programmable digital logic cell, said programmable digital logic cell providing a plurality of different accessible circuit configurations or comprising a voltage level controller, comprising:
    measuring at least one electrical performance parameter that can affect a processing speed of said programmable digital logic cell or at least one parameter that can affect said electrical performance parameter to obtain calibration data using a reference device comprising at least one programmable reference digital logic cell that matches said programmable logic cell;

programming said programmable digital logic cell to select a first of said plurality of different circuit configurations or a voltage level output by said voltage level controller based on said calibration data, wherein said programming changes said processing speed of said programmable digital logic cell;

generating at least one control signal using said calibration data, wherein said control signal implements said programming, wherein said generating said control signal comprises an iterative trial-and-error generation process varying said control signal until a desired response for said programmable reference digital logic cell is obtained.

12. A method for calibrating an integrated circuit (IC) comprising at least one programmable digital logic cell, said programmable digital logic cell providing a plurality of different accessible circuit configurations or comprising a voltage level controller, comprising:

measuring at least one electrical performance parameter that can affect a processing speed of said programmable digital logic cell or at least one parameter that can affect said electrical performance parameter to obtain calibration data using a reference device comprising a plurality of reference circuits with respective ones of said plurality of reference circuits formed in a plurality of separate portions of said IC;

programming said programmable digital logic cell to select a first of said plurality of different circuit configurations or a voltage level output by said voltage level controller based on said calibration data, wherein said programming changes said processing speed of said programmable digital logic cell;

generating at least one control signal using said calibration data, wherein said control signal implements said programming, said at least one control signal comprises a plurality of control signals, respective ones of said plurality of control signals formed in respective ones of said plurality of separate portions of said IC.

13. The method of claim 1, wherein said parameter that can affect said electrical performance parameter comprises temperature.

14. The method of claim 1, wherein said programming said programmable digital logic cell comprises selecting said voltage level output.

15. An integrated circuit (IC) including self-calibrating digital logic, comprising:

at least one programmable digital logic cell, said programmable digital logic cell providing at least one of (i) a plurality of different accessible circuit configurations and (ii) a voltage level controller, and a self-calibration system, comprising:
at least one reference device;
a measurement device for measuring at least one electrical performance parameter that can affect a processing speed of said programmable digital logic cell or at least one parameter that can affect said electrical performance parameter to obtain calibration data using said reference device;
a processing device including an associated data store for mapping said calibration data or a parameter derived therefrom for generating at least a first control signal that is operable to select a first of said plurality of different accessible circuit configurations or a voltage level output provided by said voltage level controller, coupling of said first control signal to said programmable digital logic cell to change said processing speed of said programmable digital logic cell.

16. The IC of claim 15, wherein said programmable digital logic cell comprises:

a first dedicated digital logic cell including a plurality of nodes including at least one input node and at least one output node that reflects performance of a digital logic function, programmable tuning circuitry comprising at least one tuning input and at least one tuning circuit output, and circuitry for coupling or decoupling at least one of said tuning input and said tuning circuit output to at least one of said plurality of nodes of said first dedicated digital logic cell, wherein said circuitry for coupling or decoupling comprises a first fuse coupled to said tuning input or a second fuse coupled to said tuning circuit output, and wherein said first control signal selects said first of said plurality of different accessible circuit configurations by changing a state of said first or said second fuse.

17. The IC of claim 15, wherein said programmable digital logic cell comprises:

a first dedicated digital logic cell including a plurality of nodes including at least one input node and at least one output node that reflects performance of a digital logic function, programmable tuning circuitry comprising at least one tuning input and at least one tuning circuit output, and circuitry for coupling or decoupling at least one of said tuning input and said tuning circuit output to at least one of said plurality of nodes of said first dedicated digital logic cell, wherein said programmable tuning circuitry comprises at least one matched digital logic cell relative to said first dedicated digital logic cell configured to perform said digital logic function, said matched digital logic cell connected to said dedicated digital logic cell when said circuitry for coupling or decoupling couples said matched digital logic cell to said first dedicated digital logic cell.

18. The IC of claim 17, wherein said at least one matched digital logic cell comprises a plurality of said matched digital logic cells, wherein at least a portion of said plurality of said matched digital logic cells have a different drive strength as compared to a drive strength of said first dedicated digital logic cell.

19. The IC of claim 18, wherein said plurality of said matched digital logic cells provide a plurality of different levels of said drive strength.

20. The IC of claim 15, wherein said data store comprises a lookup table, linear function, or a non-linear function.

21. The IC of claim 15, wherein said electrical performance parameter comprises at least one process strength parameter, and wherein said processing circuit is operable to:

compare said process strength parameter to a predetermined process strength limit value or range to determine if said process strength parameter is weak, and if said process strength parameter is weak, coupling said first control signal to said programmable digital logic cell.

22. The IC of claim 15, wherein said reference device comprises a delay line, wherein said calibration data comprises a time-based measurement based on a time for a test signal to traverse said delay line.

23. The IC of claim 15, wherein said reference device comprises an oscillator circuit associated with at least one logic cell, wherein said electrical performance parameter comprises an oscillation frequency of said oscillator circuit.

24. The IC of claim 15, wherein said reference device comprises at least one programmable reference logic cell that matches said programmable digital logic cell.

25. The IC of claim 15, wherein said reference device comprises a plurality of reference circuits with respective ones of said plurality of reference circuits formed in a plurality of separate portions of said IC, and said at least a first control signal comprises a plurality of control signals, respective ones of said plurality of control signals formed in respective ones of said plurality of separate portions of said IC.

26. The IC of claim 15, wherein said reference device comprises a temperature sensor and said parameter that can affect said electrical performance parameter comprises temperature.

27. The method of claim 5, further comprising generating at least one control signal using said calibration data, wherein said control signal implements said programming.

28. The method of claim 27, further comprising comparing said calibration data to a predetermined limit or range, and when said calibration data is determined to be outside said predetermined limit or range, generating said control signal to implement said programming.

29. The method of claim 27, wherein said control signal is obtained by mapping said calibration data or a parameter derived therefrom to obtain said control signal using a lookup table, linear function or a non-linear function.

30. The method of claim 5, wherein said parameter that can affect said electrical performance parameter comprises temperature.

31. The method of claim 5, wherein said programming said programmable digital logic cell comprises selecting said voltage level output.

32. The method of claim 10, wherein said parameter that can affect said electrical performance parameter comprises temperature.

33. The method of claim 10, wherein said programming said programmable digital logic cell comprises selecting said voltage level output.

34. The method of claim 11, wherein said parameter that can affect said electrical performance parameter comprises temperature.

35. The method of claim 11, wherein said programming said programmable digital logic cell comprises selecting said voltage level output.

36. The method of claim 12, wherein said parameter that can affect said electrical performance parameter comprises temperature.

37. The method of claim 12, wherein said programming said programmable digital logic cell comprises selecting said voltage level output.

* * * * *